US012160206B2

United States Patent
Billa et al.

(10) Patent No.: US 12,160,206 B2
(45) Date of Patent: Dec. 3, 2024

(54) DC-BLOCKING AMPLIFIER WITH ALIASING TONE CANCELLATION CIRCUIT

(71) Applicant: MEDIATEK INC., Hsin-Chu (TW)

(72) Inventors: Sujith Kumar Billa, Hsinchu (TW); Sung-Han Wen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 235 days.

(21) Appl. No.: 17/751,630

(22) Filed: May 23, 2022

(65) Prior Publication Data

US 2022/0407476 A1    Dec. 22, 2022

Related U.S. Application Data

(60) Provisional application No. 63/211,036, filed on Jun. 16, 2021.

(51) Int. Cl.
   *H03F 3/45* (2006.01)
   *H03F 1/30* (2006.01)
   *H03F 3/00* (2006.01)

(52) U.S. Cl.
   CPC ............. *H03F 3/005* (2013.01); *H03F 1/303* (2013.01); *H03F 3/45076* (2013.01)

(58) Field of Classification Search
   CPC ............... H03F 3/005; H03F 2200/129; H03F 2200/153; H03F 2200/156; H03F 2200/27; H03F 2203/45422; H03F 2203/45512; H03F 2203/45514; H03F 2203/45542; H03F 2203/45544; H03F 2203/45546; H03F 2203/45551; H03F 2203/45616; H03F 3/45475; H03F 1/086; H03F 1/3211; H03F 1/14; H03F 2203/45148; H03F 2203/45151
   USPC ....................................................... 330/9, 51
   See application file for complete search history.

(56) References Cited

U.S. PATENT DOCUMENTS

| | | | |
|---|---|---|---|
| 4,806,874 A * | 2/1989 | Michel | H03F 3/005 330/9 |
| 6,035,049 A | 3/2000 | Engh | |
| 8,638,165 B2 | 1/2014 | Shah et al. | |
| 10,199,995 B2 | 2/2019 | Lin et al. | |
| 2012/0306575 A1 | 12/2012 | Shah | |
| 2013/0113550 A1 | 5/2013 | Bawa | |

* cited by examiner

*Primary Examiner* — Andrea Lindgren Baltzell
*Assistant Examiner* — Khiem D Nguyen
(74) *Attorney, Agent, or Firm* — Winston Hsu

(57) ABSTRACT

The present invention provides an amplifier circuit, wherein the amplifier circuit includes an input terminal, a capacitor, an amplifier, a feedback circuit and an aliasing tone cancellation circuit. The input terminal is configured to receive a first input signal. The capacitor is coupled to the input terminal. The amplifier is configured to receive the input signal through the capacitor to generate an output signal. The feedback circuit is coupled between an input node and an output node of the amplifier, and is configured to generate a feedback signal according to the output signal, wherein the feedback circuit includes a storage block including a switched-capacitor. The aliasing tone cancellation circuit is coupled between the input terminal of the amplifier circuit and the input node of the amplifier, and configured to generate a signal to cancel or reduce an aliasing tone of the feedback signal according to the input signal.

11 Claims, 13 Drawing Sheets

First phase : opposite charges on storage blocks

Second phase : charge sharing between two storage blocks

US 12,160,206 B2

DC-BLOCKING AMPLIFIER WITH ALIASING TONE CANCELLATION CIRCUIT

CROSS REFERENCE TO RELATED APPLICATIONS

This application claims the benefit of U.S. Provisional Application No. 63/211,036, filed on Jun. 16, 2021. The content of the application is incorporated herein by reference.

BACKGROUND

In an amplifier with an input capacitor for DC blocking, a switched-capacitor is generally used as a feedback circuit to provide high impedance for stabilizing operating points of an input terminal and an output terminal of the amplifier. However, because the switched-capacitor is controlled by a clock signal, an output signal of the amplifier will be mixed with the clock signal to generate an aliasing tone with lower frequency to the input terminal of the amplifier, and this aliasing tone is also processed by the amplifier and affects the output signal.

SUMMARY

It is therefore an objective of the present invention to provide an amplifier with an aliasing tone cancellation circuit, to solve the above-mentioned problems.

According to one embodiment of the present invention, an amplifier circuit is disclosed. The amplifier circuit comprises an input terminal, a capacitor, an amplifier, a feedback circuit and an aliasing tone cancellation circuit. The input terminal is configured to receive a first input signal. The capacitor is coupled to the input terminal. The amplifier is configured to receive the input signal through the capacitor to generate an output signal. The feedback circuit is coupled between an input node and an output node of the amplifier, and is configured to generate a feedback signal according to the output signal, wherein the feedback circuit comprises a storage block comprising a switched-capacitor. The aliasing tone cancellation circuit is coupled between the input terminal of the amplifier circuit and the input node of the amplifier, and configured to generate a signal to cancel or reduce an aliasing tone of the feedback signal according to the input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
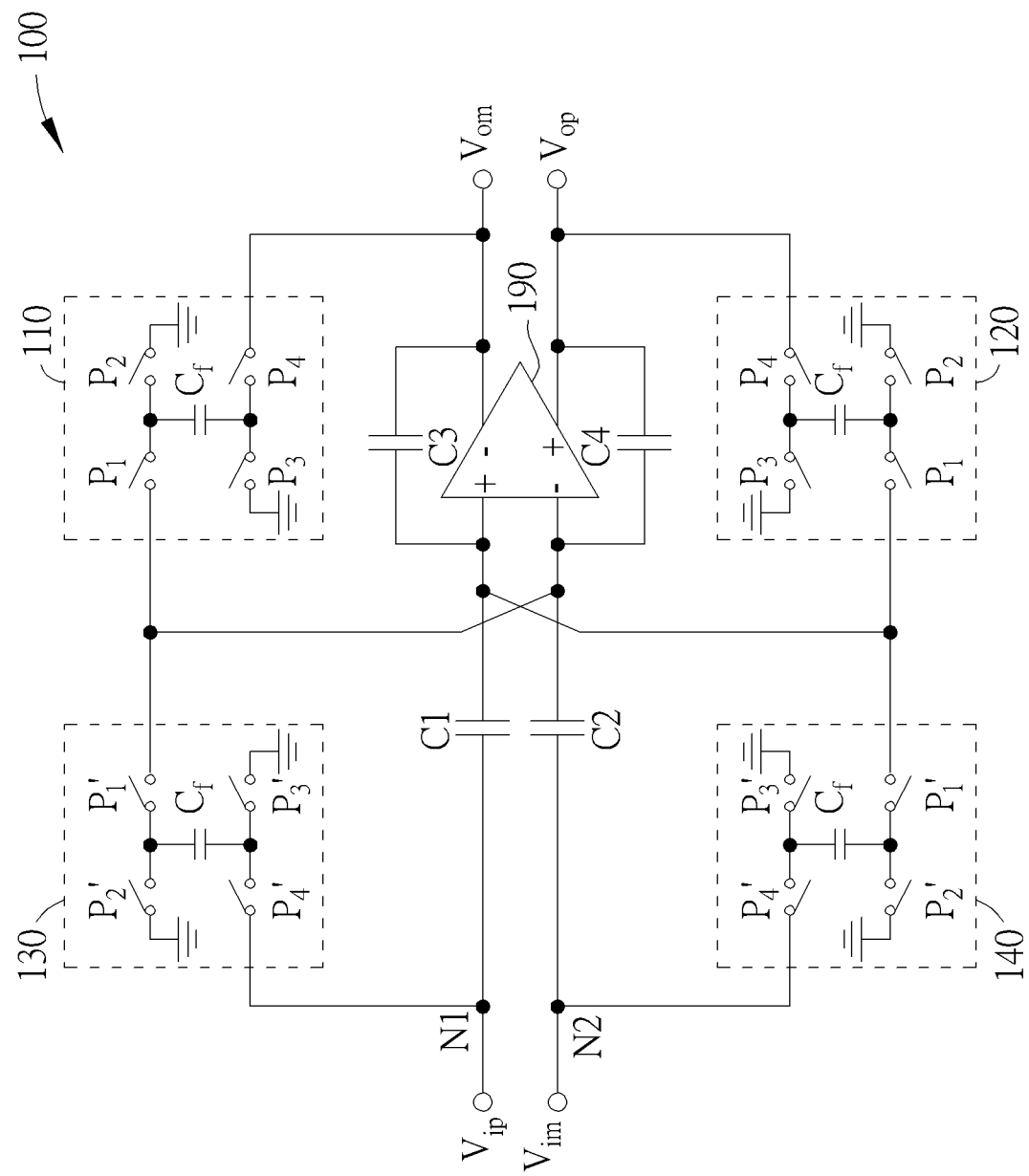
FIG. 1 is a diagram illustrating an amplifier circuit according to one embodiment of the present invention.

FIG. 1 is a diagram illustrating an amplifier circuit 100 according to one embodiment of the present invention. As shown in FIG. 1, the amplifier circuit 100 comprises two input terminals N1 and N2, two capacitors C1 and C2, an amplifier 190, two feedback capacitors C3 and C4, and four storage blocks 110, 120, 130 and 140. In this embodiment, the capacitors C1 and C2 serve as DC-blocking circuits, and the capacitors C1 and C2 are coupled between input terminals of the amplifier 190 and the input terminals N1 and N2, for example, one node of the capacitor C1 is coupled to the input terminal N1, the other node of the capacitor C1 is coupled to a positive input node of the amplifier 190, one node of the capacitor C2 is coupled to the input terminal N2, and the other node of the capacitor C2 is coupled to a negative input node of the amplifier 190. The feedback capacitor C3 is coupled between a negative output node and the positive input node of the amplifier 190, and the feedback capacitor C4 is coupled between a positive output node and the negative input node of the amplifier 190. Each of the storage block 110 and the storage block 120 comprises a switched-capacitor including a capacitor Cf with four switches P1-P4, the storage block 110 is coupled between the negative output node and the negative input node of the amplifier 190, and the storage block 120 is coupled between the positive output node and the positive input node of the amplifier 190. Each of the storage block 130 and the storage block 140 comprises a switched-capacitor including a capacitor Cf with four switches P1'-P4', the storage block 130 is coupled between the negative input node of the amplifier 190 and the input terminal N1, and the storage block 140 is coupled between the positive input node of the amplifier 190 and the input terminal N2. In this embodiment, the amplifier circuit 100 can be used to receive a differential input signal Vip and Vim to generate a differential output signal Vom and Vop, wherein the differential input signal may be audio signals from a microphone.

In the embodiment shown in FIG. 1, because the DC voltages of the differential input signal Vip and Vim may be different, the capacitors C1 and C2 serving as the DC-blocking circuits can ensure that the amplifier 190 will not be affected by the different DC voltages. The storage blocks 110 and 120 are configured to provide suitable operating points (DC voltages) for the positive/negative input nodes and the positive/negative output nodes of the amplifier 190. In addition, because the switches P1-P4 are controlled by clock signals, and the output signals Vom and Vop are mixed by these clock signals to generate an aliasing tones that may affect the output signals Vom and Vop, the storage blocks 130 and 140 can serve as an aliasing tone cancellation circuit to cancel or reduce the aliasing tones of the feedback signal generated by the storage blocks 110 and 120, to improve the quality of the output signals Vom and Vop.

Figure 2:
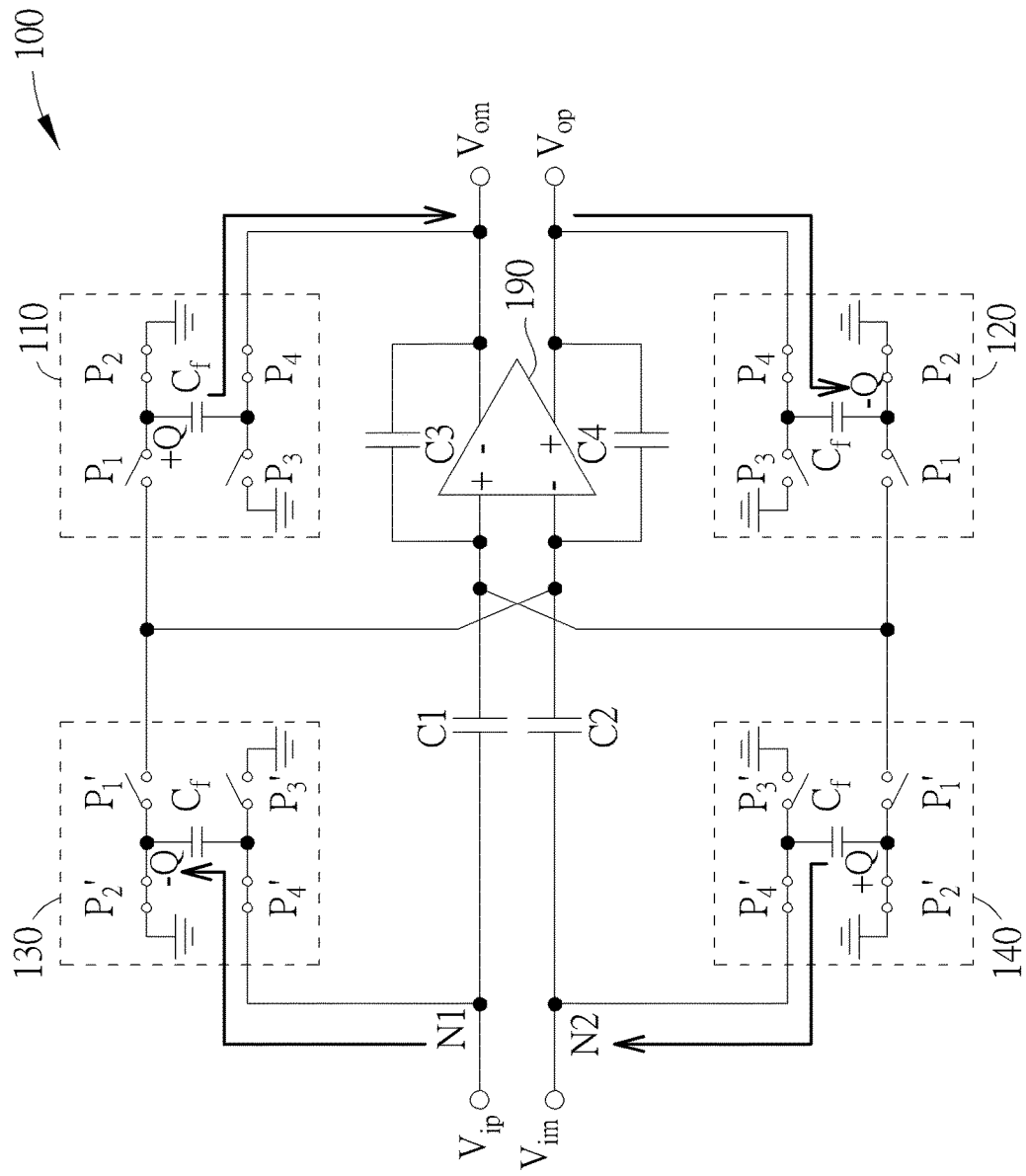
FIG. 2 shows a first phase of the amplifier circuit shown in FIG. 1 according to one embodiment of the present invention.
Figure 3:
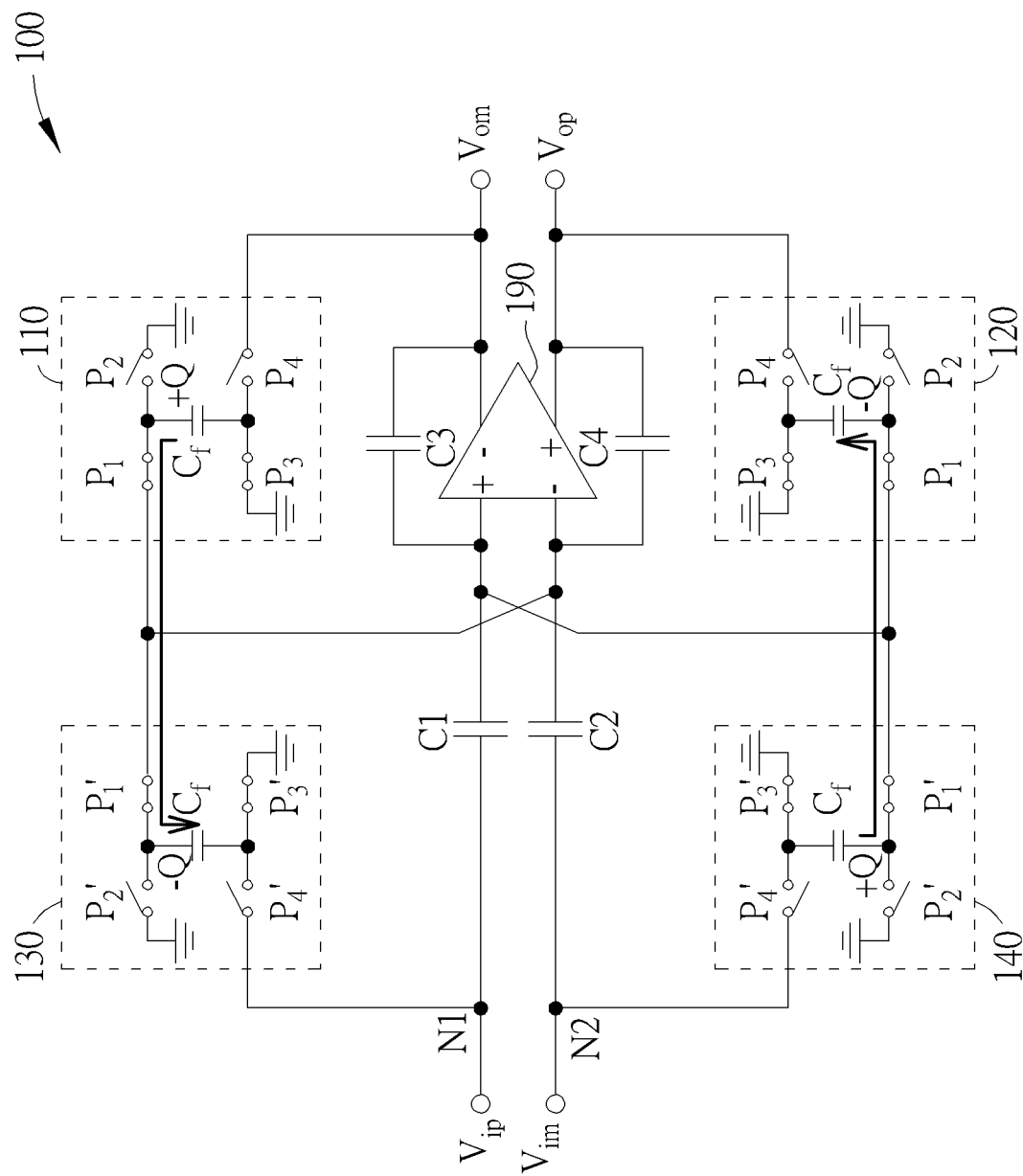
FIG. 3 shows a second phase of the amplifier circuit shown in FIG. 1 according to one embodiment of the present invention.

Specifically, referring to FIG. 2 showing a first phase of the amplifier circuit 100, the switches P2 and P4 of the storage blocks 110 and 120 are enabled while the switches P1 and P3 of the storage blocks 110 and 120 are disabled, and the switches P2' and P4' of the storage blocks 130 and 140 are enabled while the switches P1' and P3' of the storage blocks 130 and 140 are disabled. In the first phase, the capacitors Cf in the storage blocks 110-140 are charged or discharged so that the capacitors Cf of the storage block 130 and the storage block 110 have equal and opposite charges (for example, an upper plate of the capacitor Cf in the storage block 130 has "−Q" while an upper plate the capacitor Cf in the storage block 110 has "+Q"), and the capacitors Cf of the storage block 140 and the storage block 120 have equal and opposite charges (for example, a lower plate of the capacitor Cf in the storage block 140 has "+Q" while a lower plate of the capacitor Cf in the storage block 120 has "−Q"). Then, referring to FIG. 3 showing a second phase of the amplifier circuit 100 immediately following the first phase, the switches P1 and P3 of the storage blocks 110 and 120 are enabled while the switches P2 and P4 of the storage blocks 110 and 120 are disabled, and the switches P1' and P3' of the storage blocks 130 and 140 are enabled while the switches P2' and P4' of the storage blocks 130 and 140 are disabled. In the second phase, the capacitors Cf in the storage block 110 is connected to the capacitor Cf in the storage block 130, and a charge sharing occurs between the storage blocks 110 and 130 so that the aliasing tone generated by the storage block 110 is canceled by the storage block 130 (i.e., the aliasing tone will not enter the negative input node of the amplifier 190). Similarly, the capacitors Cf in the storage block 120 is connected to the capacitor Cf in the storage block 140, and a charge sharing occurs between the storage blocks 120 and 140 so that the aliasing tone generated by the storage block 120 is canceled by the storage block 140 (i.e., the aliasing tone will not enter the positive input node of the amplifier 190). Then, the amplifier circuit 100 operates in the first phase and the second phase alternatively.

In this embodiment, the storage block 130 is a replica of the storage block 110, and the storage block 140 is a replica of the storage block 120, that is the storage block 130/140 has the same circuit structure as the storage block 110/120, and the clock signals for controlling the storage block 130/140 and the clock signals for controlling the storage block 110/120 are substantially the same, but this feature is not a limitation of the present invention. In other embodiments, as long as the storage block 130/140 can cancel or reduce the aliasing tone of the feedback signal generated by the storage block 110/120, the storage block 130/140 and the storage block 110/120 may have different circuit designs.

Figure 4:
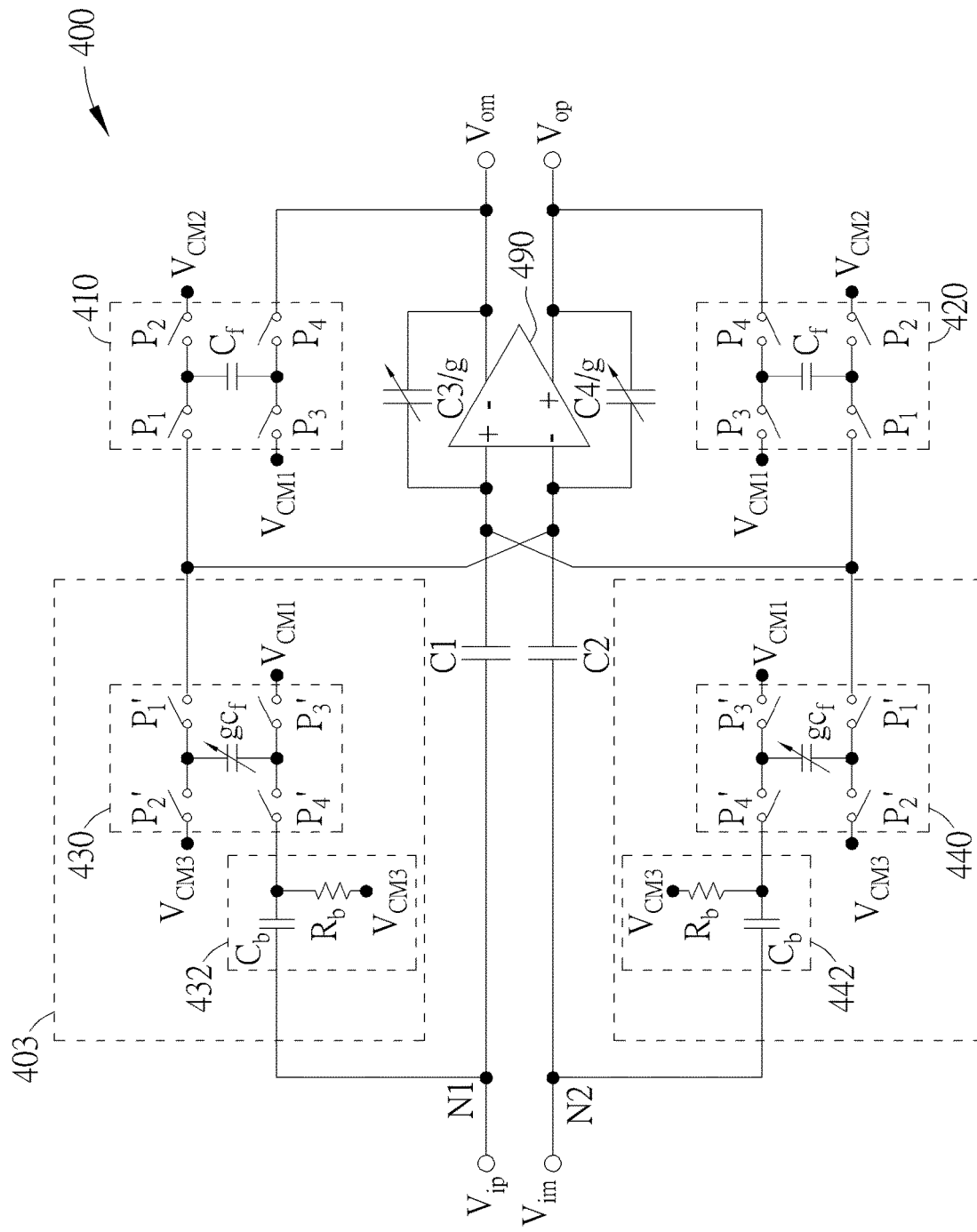
FIG. 4 is a diagram illustrating an amplifier circuit according to one embodiment of the present invention.

FIG. 4 is a diagram illustrating an amplifier circuit 400 according to one embodiment of the present invention. As shown in FIG. 4, the amplifier circuit 400 comprises two input terminals N1 and N2, two capacitors C1 and C2, an amplifier 490, two feedback capacitors C3 and C4, two storage blocks 410 and 420, and two aliasing tone cancellation circuits 403 and 404, wherein the aliasing tone cancellation circuit 403 comprises a storage block 430 and a frequency-selective circuit (in this embodiment, a DC-blocking circuit 432 serves as the frequency-selective circuit), and the aliasing tone cancellation circuit 404 comprises a storage block 440 and a frequency-selective circuit (in this embodiment, a DC-blocking circuit 442 serves as the frequency-selective circuit). In this embodiment, the capacitors C1 and C2 serve as DC-blocking circuits, and the capacitors C1 and C2 are coupled between input terminals of the amplifier 490 and the input terminals N1 and N2, for example, one node of the capacitor C1 is coupled to the input terminal N1, the other node of the capacitor C1 is coupled to a positive input node of the amplifier 490, one node of the capacitor C2 is coupled to the input terminal N2, and the other node of the capacitor C2 is coupled to a negative input node of the amplifier 490. The feedback capacitor C3 is a variable capacitor coupled between a negative output node and the positive input node of the amplifier 490, and the feedback capacitor C4 is a variable capacitor coupled between a positive output node and the negative input node of the amplifier 490, wherein the capacitance of each of the feedback capacitors C3 and C4 is scaled by using a factor "g" shown in FIG. 4. Each of the storage block 410 and the storage block 420 comprises a switched-capacitor including a capacitor Cf with four switches P1-P4, the storage block 410 is coupled between the negative output node and the negative input node of the amplifier 490, and the storage block 420 is coupled between the positive output node and the positive input node of the amplifier 490, wherein the storage blocks 410 and 420 are coupled to bias voltages VCM1 and VCM2. The DC-blocking circuit 432 comprises a capacitor Cb and a resistor Rb coupled to a bias voltage VCM3, wherein the capacitor Cb is coupled to the input terminal N1. The DC-blocking circuit 442 comprises a capacitor Cb and a resistor Rb coupled to the bias voltage VCM3, wherein the capacitor Cb is coupled to the input terminal N2. Each of the storage block 430 and the storage block 440 comprises a switched-capacitor including a capacitor Cf with four switches P1'-P4', the storage block 430 is coupled between the negative input node of the amplifier 490 and DC-blocking circuit 432, and the storage block 440 is coupled between the positive input node of the amplifier 490 and the DC-blocking circuit 442, wherein the capacitor Cf in each of the storage blocks 430 and 440 is scaled by the factor "g". In this embodiment, the amplifier circuit 400 can be used to receive a differential input signal Vip and Vim to generate a differential output signal Vom and Vop, wherein the differential input signal may be audio signals from a microphone.

In the embodiment shown in FIG. 4, the DC-blocking circuit 432 receives the input signal Vip to block the DC component to generate an AC signal, and the storage block 430 receives the AC signal to generate a signal for canceling or reducing the aliasing tone generated by the storage block 410. Similarly, the DC-blocking circuit 442 receives the input signal Vim to block the DC component to generate an AC signal, and the storage block 440 receives the AC signal to generate a signal for canceling or reducing the aliasing tone generated by the storage block 420. Therefore, in the case that the DC voltages of the input signals Vip and Vim are different, the aliasing tone cancellation circuits 403 and 404 can work better than the embodiment shown in FIG. 1.

Figure 5:
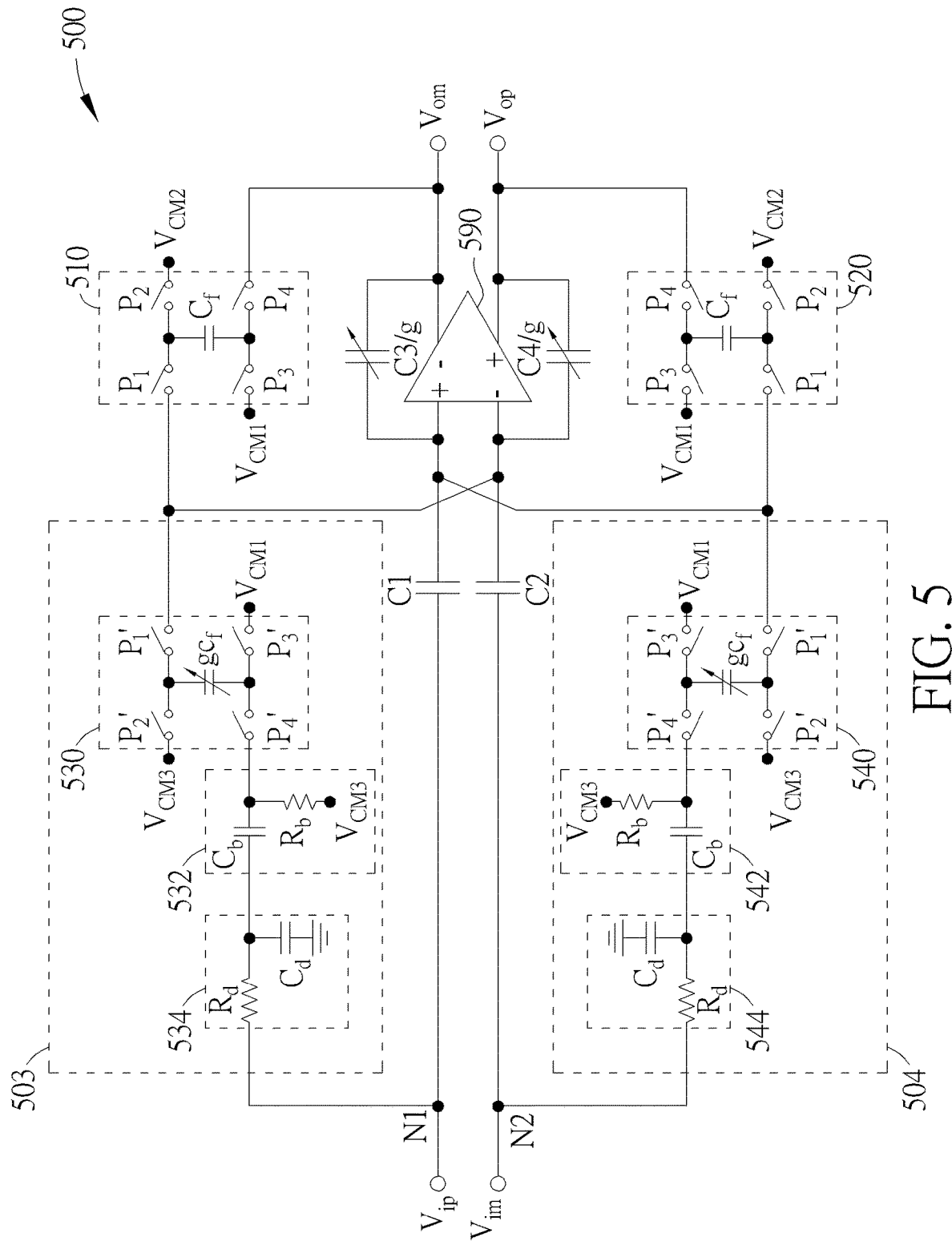
FIG. 5 is a diagram illustrating an amplifier circuit according to one embodiment of the present invention.

FIG. 5 is a diagram illustrating an amplifier circuit 500 according to one embodiment of the present invention. As shown in FIG. 5, the amplifier circuit 500 comprises two input terminals N1 and N2, two capacitors C1 and C2, an amplifier 590, two feedback capacitors C3 and C4, two storage blocks 510 and 520, and two aliasing tone cancellation circuits 503 and 504, wherein the aliasing tone cancellation circuit 503 comprises a storage block 530, a frequency-selective circuit (in this embodiment, a DC-blocking circuit 532 serves as the frequency-selective circuit) and a delay circuit 534, and the aliasing tone cancellation circuit 504 comprises a storage block 540, a frequency-selective circuit (in this embodiment, a DC-blocking circuit 542 serves as the frequency-selective circuit) and a delay circuit 544. In this embodiment, the capacitors C1 and C2 serve as DC-blocking circuits, and the capacitors C1 and C2 are coupled between input terminals of the amplifier 590 and the input terminals N1 and N2, for example, one node of the capacitor C1 is coupled to the input terminal N1, the other node of the capacitor C1 is coupled to a positive input node of the amplifier 590, one node of the capacitor C2 is coupled to the input terminal N2, and the other node of the capacitor C2 is coupled to a negative input node of the amplifier 590. The feedback capacitor C3 is a variable capacitor coupled between a negative output node and the positive input node of the amplifier 590, and the feedback capacitor C4 is a variable capacitor coupled between a positive output node and the negative input node of the amplifier 590, wherein the capacitance of each of the feedback capacitors C3 and C4 is scaled by using a factor "g" shown in FIG. 5. Each of the storage block 510 and the storage block 520 comprises a switched-capacitor including a capacitor Cf with four switches P1-P4, the storage block 510 is coupled between the negative output node and the negative input node of the amplifier 590, and the storage block 520 is coupled between the positive output node and the positive input node of the amplifier 590, wherein the storage blocks 510 and 520 are coupled to bias voltages VCM1 and VCM2. Each of the delay circuit 534 and the delay circuit 544 comprises a capacitor Cd and a resistor Rd, wherein the delay circuit 534 is coupled to the input terminal N1, and the delay circuit 544 is coupled to the input terminal N2. The DC-blocking circuit 532 comprises a capacitor Cb and a resistor Rb coupled to a bias voltage VCM3. The DC-blocking circuit 542 comprises a capacitor Cb and a resistor Rb coupled to the bias voltage VCM3. Each of the storage block 530 and the storage block 540 comprises a switched-capacitor including a capacitor Cf with four switches P1'-P4', the storage block 530 is coupled between the negative input node of the amplifier 590 and DC-blocking circuit 532, and the storage block 540 is coupled between the positive input node of the amplifier 590 and the DC-blocking circuit 542, wherein the capacitor Cf in each of the storage blocks 530 and 540 is scaled by the factor "g". In this embodiment, the amplifier circuit 500 can be used to receive a differential input signal Vip and Vim to generate a differential output signal Vom and Vop.

In the embodiment shown in FIG. 5, the delay circuit 534 delays the input signal Vip to generate a delayed input signal, the DC-blocking circuit 532 receives the delayed input signal to block the DC component to generate an AC signal, and the storage block 530 receives the AC signal to generate a signal for canceling or reducing the aliasing tone generated by the storage block 510. Similarly, the delay circuit 544 delays the input signal Vim to generate a delayed input signal, the DC-blocking circuit 542 receives the delayed input signal to block the DC component to generate an AC signal, and the storage block 540 receives the AC signal to generate a signal for canceling or reducing the aliasing tone generated by the storage block 520. Therefore, in the case that the amplifier 590 and the storage blocks 510 and 520 have larger signal delay amount, the aliasing tone cancellation circuits 503 and 504 having delay circuits can exactly cancel or reduce the aliasing tone of the feedback signal generated by the storage blocks 510 and 520.

Figure 6:
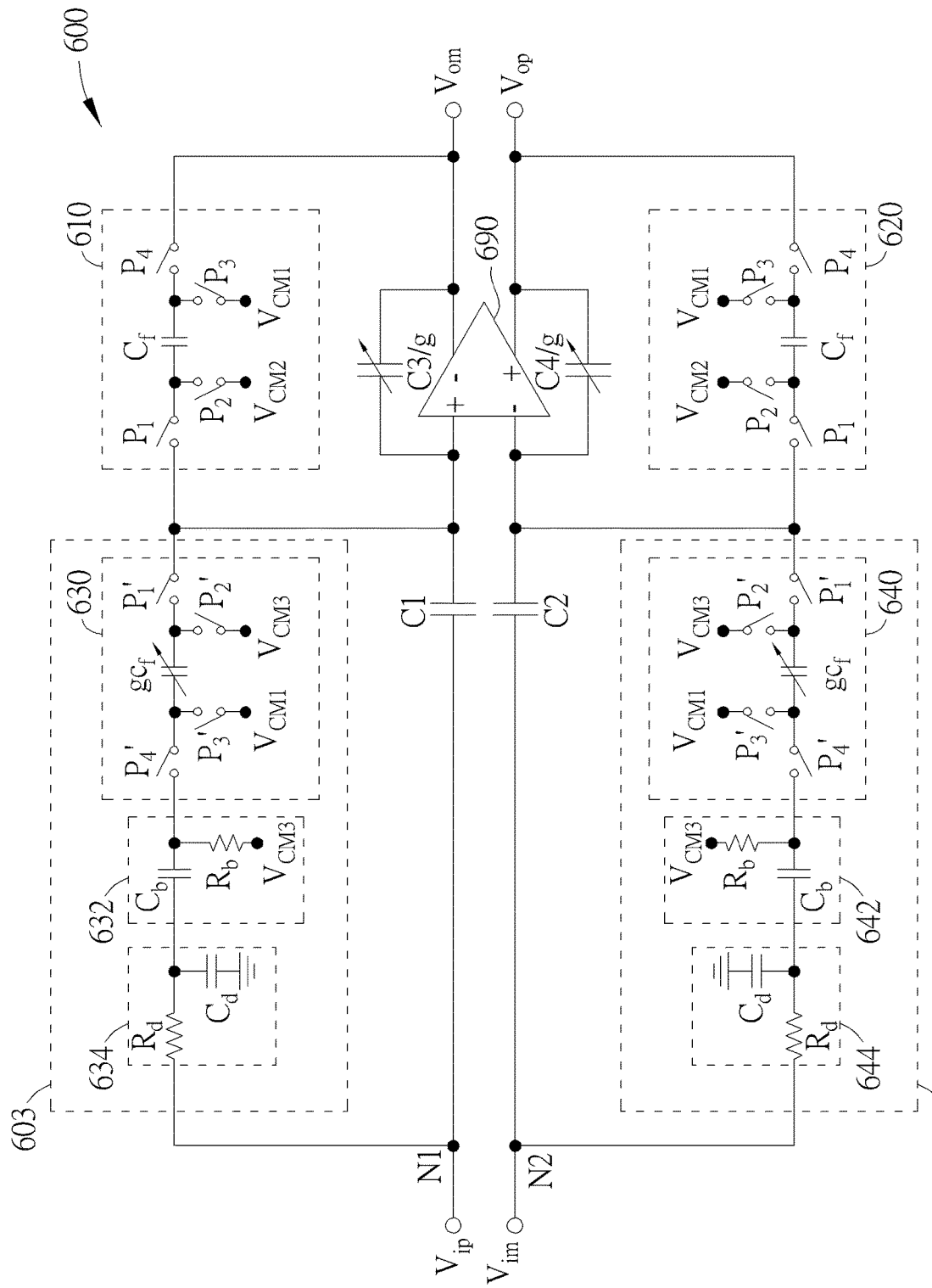
FIG. 6 is a diagram illustrating an amplifier circuit according to one embodiment of the present invention.

FIG. 6 is a diagram illustrating an amplifier circuit 600 according to one embodiment of the present invention. As shown in FIG. 6, the amplifier circuit 600 comprises two input terminals N1 and N2, two capacitors C1 and C2, an amplifier 690, two feedback capacitors C3 and C4, two storage blocks 610 and 620, and two aliasing tone cancellation circuits 603 and 604, wherein the aliasing tone cancellation circuit 603 comprises a storage block 630, a frequency-selective circuit (in this embodiment, a DC-blocking circuit 632 serves as the frequency-selective circuit) and a delay circuit 634, and the aliasing tone cancellation circuit 604 comprises a storage block 640, a frequency-selective circuit (in this embodiment, a DC-blocking circuit 642 serves as the frequency-selective circuit) and a delay circuit 644. In this embodiment, the capacitors C1 and C2 serve as DC-blocking circuits, and the capacitors C1 and C2 are coupled between input terminals of the amplifier 690 and the input terminals N1 and N2, for example, one node of the capacitor C1 is coupled to the input terminal N1, the other node of the capacitor C1 is coupled to a positive input node of the amplifier 690, one node of the capacitor C2 is coupled to the input terminal N2, and the other node of the capacitor C2 is coupled to a negative input node the amplifier 690. The feedback capacitor C3 is a variable capacitor coupled between a negative output node and the positive input node of the amplifier 690, and the feedback capacitor C4 is a variable capacitor coupled between a positive output node and the negative input node of the amplifier 690, wherein the capacitance of each of the feedback capacitors C3 and C4 is scaled by using a factor "g" shown in FIG. 6. Each of the storage block 610 and the storage block 620 comprises a switched-capacitor including a capacitor Cf with four switches P1-P4, the storage block 610 is coupled between the negative output node and the positive input node of the amplifier 690, and the storage block 620 is coupled between the positive output node and the negative input node of the amplifier 690, wherein the storage blocks 610 and 620 are coupled to bias voltages VCM1 and VCM2. Each of the delay circuit 634 and the delay circuit 644 comprises a capacitor Cd and a resistor Rd, wherein the delay circuit 634 is coupled to the input terminal N1, and the delay circuit 644 is coupled to the input terminal N2. The DC-blocking circuit 632 comprises a capacitor Cb and a resistor Rb coupled to a bias voltage VCM3. The DC-blocking circuit 642 comprises a capacitor Cb and a resistor Rb coupled to the bias voltage VCM3. Each of the storage block 630 and the storage block 640 comprises a switched-capacitor including a capacitor Cf with four switches P1'-P4', the storage block 630 is coupled between the positive input node of the amplifier 690 and DC-blocking circuit 632, and the storage block 640 is coupled between the negative input node of the amplifier 690 and the DC-blocking circuit 642, wherein the capacitor Cf in each of the storage blocks 630 and 640 is scaled by the factor "g".

In this embodiment, the amplifier circuit 600 can be used to receive a differential input signal Vip and Vim to generate a differential output signal Vom and Vop.

In the embodiment shown in FIG. 6, the delay circuit 634 delays the input signal Vip to generate a delayed input signal, the DC-blocking circuit 632 receives the delayed input signal to block the DC component to generate an AC signal, and the storage block 630 receives the AC signal to generate a signal for canceling or reducing the aliasing tone generated by the storage block 610. Similarly, the delay circuit 644 delays the input signal Vim to generate a delayed input signal, the DC-blocking circuit 642 receives the delayed input signal to block the DC component to generate an AC signal, and the storage block 640 receives the AC signal to generate a signal for canceling or reducing the aliasing tone generated by the storage block 620. Therefore, in the case that the amplifier 690 and the storage blocks 610 and 620 have larger signal delay amount, the aliasing tone cancellation circuits 603 and 604 having delay circuits can exactly cancel or reduce the aliasing tone of the feedback signal generated by the storage blocks 610 and 620.

Figure 7:
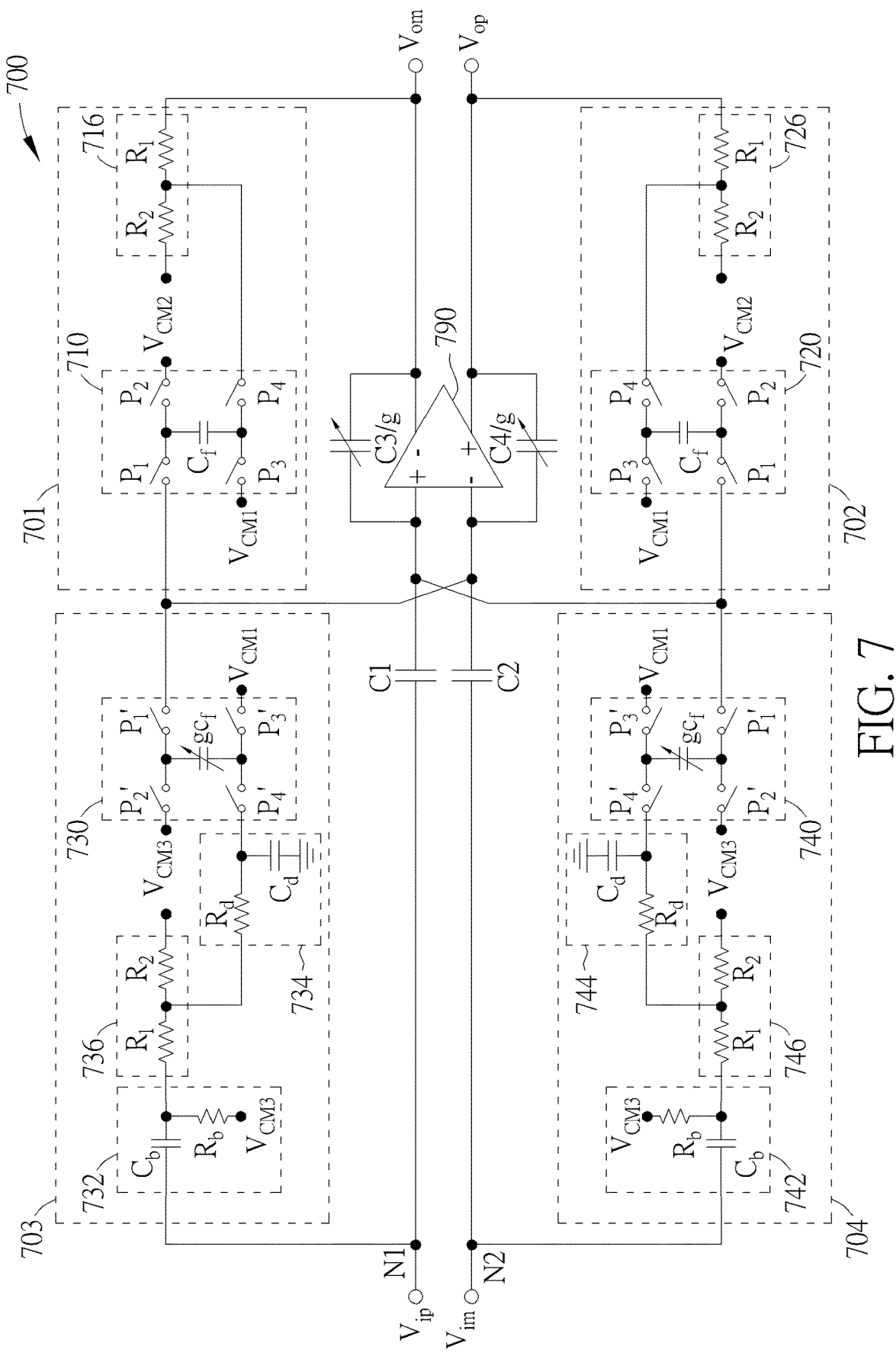
FIG. 7 is a diagram illustrating an amplifier circuit according to one embodiment of the present invention.

FIG. 7 is a diagram illustrating an amplifier circuit 700 according to one embodiment of the present invention. As shown in FIG. 7, the amplifier circuit 700 comprises two input terminals N1 and N2, two capacitors C1 and C2, an amplifier 790, two feedback capacitors C3 and C4, two feedback circuits 701 and 702, and two aliasing tone cancellation circuits 703 and 704, wherein the feedback circuit 701 comprises a storage block 710 and a voltage scaling circuit 716, the feedback circuit 702 comprises a storage block 720 and a voltage scaling circuit 726, the aliasing tone cancellation circuit 703 comprises a storage block 730, a frequency-selective circuit (in this embodiment, a DC-blocking circuit 732 serves as the frequency-selective circuit), a delay circuit 734 and a voltage scaling circuit 736, and the aliasing tone cancellation circuit 704 comprises a storage block 740, a frequency-selective circuit (in this embodiment, a DC-blocking circuit 742 serves as the frequency-selective circuit), a delay circuit 744 and a voltage scaling circuit 746. In this embodiment, the capacitors C1 and C2 serve as DC-blocking circuits, and the capacitors C1 and C2 are coupled between input terminals of the amplifier 790 and the input terminals N1 and N2, for example, one node of the capacitor C1 is coupled to the input terminal N1, the other node of the capacitor C1 is coupled to a positive input node of the amplifier 790, one node of the capacitor C2 is coupled to the input terminal N2, and the other node of the capacitor C2 is coupled to a negative input node of the amplifier 790. The feedback capacitor C3 is a variable capacitor coupled between a negative output node and the positive input node of the amplifier 790, and the feedback capacitor C4 is a variable capacitor coupled between a positive output node and the negative input node of the amplifier 790, wherein the capacitance of each of the feedback capacitors C3 and C4 is scaled by using a factor "g" shown in FIG. 7. Each of the voltage scaling circuits 716, 726, 736 and 746 comprises resistors R1 and R2 connected in series. Each of the storage block 710 and the storage block 720 comprises a switched-capacitor including a capacitor Cf with four switches P1-P4, the storage block 710 is coupled between the negative output node and the negative input node of the amplifier 790 via the voltage scaling circuit 716, and the storage block 720 is coupled between the positive output node and the positive input node of the amplifier 790 via the voltage scaling circuit 726, wherein the storage blocks 710 and 720 are coupled to bias voltages VCM1 and VCM2. Each of the delay circuit 734 and the delay circuit 744 comprises a capacitor Cd and a resistor Rd, wherein the delay circuit 734 is coupled between the storage block 730 and the voltage scaling circuit 736, and the delay circuit 744 is coupled between the storage block 740 and the voltage scaling circuit 746. The DC-blocking circuit 732 comprises a capacitor Cb and a resistor Rb coupled to a bias voltage VCM3, and the DC-blocking circuit 732 is coupled between the input terminal N1 and the voltage scaling circuit 736. The DC-blocking circuit 742 comprises a capacitor Cb and a resistor Rb coupled to the bias voltage VCM3, and the DC-blocking circuit 742 is coupled between the input terminal N2 and the voltage scaling circuit 746. Each of the storage block 730 and the storage block 740 comprises a switched-capacitor including a capacitor Cf with four switches P1'-P4', the storage block 730 is coupled between the negative input node of the amplifier 790 and delay circuit 734, and the storage block 740 is coupled between the positive input node of the amplifier 790 and the delay circuit 744, wherein the capacitor Cf in each of the storage blocks 730 and 740 is scaled by the factor "g". In this embodiment, the amplifier circuit 700 can be used to receive a differential input signal Vip and Vim to generate a differential output signal Vom and Vop.

In the embodiment shown in FIG. 7, the DC-blocking circuit 732 receives the input signal Vip to block the DC component to generate an AC signal, the voltage scaling circuit 736 divides the AC signal to generate a divided signal, the delay circuit 734 delays the divided signal to generate a delayed signal, and the storage block 730 receives the delayed signal to generate a signal for canceling or reducing the aliasing tone generated by the storage block 710. Similarly, the DC-blocking circuit 742 receives the input signal Vim to block the DC component to generate an AC signal, the voltage scaling circuit 746 divides the AC signal to generate a divided signal, the delay circuit 744 delays the divided signal to generate a delayed signal, and the storage block 740 receives the delayed signal to generate a signal for canceling or reducing the aliasing tone generated by the storage block 720. Therefore, in the case that the DC voltages of the input signals Vip and Vim are different and the amplifier 790 and the storage blocks 710 and 720 have larger signal delay amount, the aliasing tone cancellation circuits 703 and 704 having delay circuits can exactly cancel or reduce the aliasing tone of the feedback signal generated by the storage blocks 710 and 720. In addition, by designing the voltage scaling circuits 716, 726, 736 and 746, the capacitance of Cf can be designed smaller.

Figure 8:
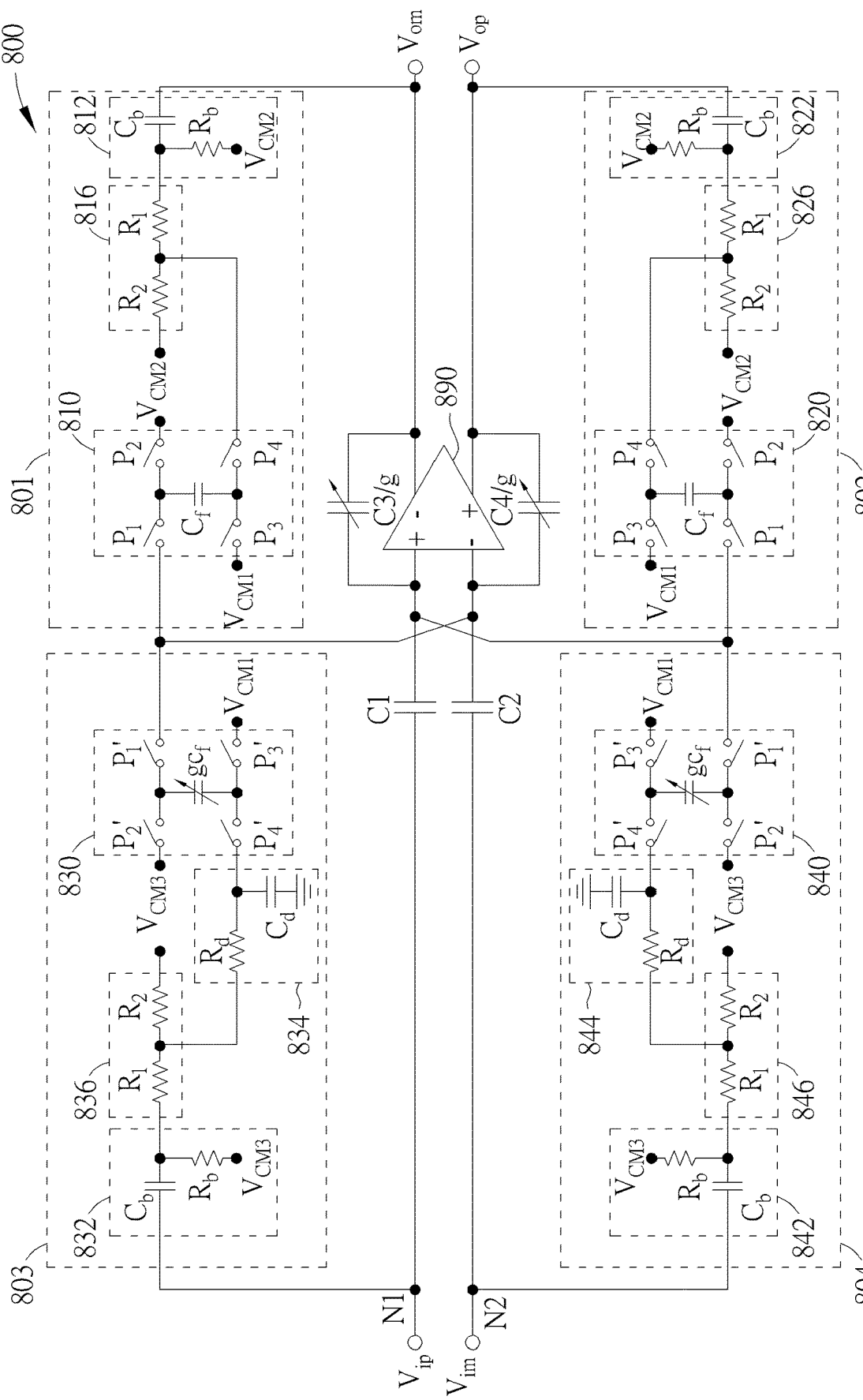
FIG. 8 is a diagram illustrating an amplifier circuit according to one embodiment of the present invention.

FIG. 8 is a diagram illustrating an amplifier circuit 800 according to one embodiment of the present invention. As shown in FIG. 8, the amplifier circuit 800 comprises two input terminals N1 and N2, two capacitors C1 and C2, an amplifier 890, two feedback capacitors C3 and C4, two feedback circuits 801 and 802, and two aliasing tone cancellation circuits 803 and 804, wherein the feedback circuit 801 comprises a storage block 810, a frequency-selective circuit (in this embodiment, a DC-blocking circuit 812 serves as the frequency-selective circuit) and a voltage scaling circuit 816; the feedback circuit 802 comprises a storage block 820, a frequency-selective circuit (in this embodiment, a DC-blocking circuit 822 serves as the frequency-selective circuit) and a voltage scaling circuit 826; the aliasing tone cancellation circuit 803 comprises a storage block 830, a frequency-selective circuit (in this embodiment, a DC-blocking circuit 832 serves as the frequency-selective circuit), a delay circuit 834 and a voltage scaling circuit 836; and the aliasing tone cancellation circuit 804 comprises a storage block 840, a frequency-selective circuit (in this embodiment, a DC-blocking circuit 842 serves as the frequency-selective circuit), a delay circuit 844 and a voltage scaling circuit 846. In this embodiment, the capacitors C1 and C2 serve as DC-blocking circuits, and the capacitors C1 and C2 are coupled between input terminals of the amplifier 890 and the input terminals N1 and N2, for example, one node of the capacitor C1 is coupled to the input terminal N1, the other node of the capacitor C1 is coupled to a positive input node of the amplifier 890, one node of the capacitor C2 is coupled to the input terminal N2, and the other node of the capacitor C2 is coupled to a negative input node of the amplifier 890. The feedback capacitor C3 is a variable capacitor coupled between a negative output node and the positive input node of the amplifier 890, and the feedback capacitor C4 is a variable capacitor coupled between a positive output node and the negative input node of the amplifier 890, wherein the capacitance of each of the feedback capacitors C3 and C4 is scaled by using a factor "g" shown in FIG. 8. Each of the voltage scaling circuits 816, 826, 836 and 846 comprises resistors R1 and R2 connected in series. Each of the DC-blocking circuits 812 and 822 comprises a capacitor Cb and a resistor Rb coupled to a bias voltage CM2. Each of the storage block 810 and the storage block 820 comprises a switched-capacitor including a capacitor Cf with four switches P1-P4, the storage block 810 is coupled between the negative output node and the negative input node of the amplifier 890 via the voltage scaling circuit 816 and the DC-blocking circuit 812, and the storage block 820 is coupled between the positive output node and the positive input node of the amplifier 890 via the voltage scaling circuit 826 and the DC-blocking circuit 822, wherein the storage blocks 810 and 820 are coupled to bias voltages VCM1 and VCM2. Each of the delay circuit 834 and the delay circuit 844 comprises a capacitor Cd and a resistor Rd, wherein the delay circuit 834 is coupled between the storage block 830 and the voltage scaling circuit 836, and the delay circuit 844 is coupled between the storage block 840 and the voltage scaling circuit 846. The DC-blocking circuit 832 comprises a capacitor Cb and a resistor Rb coupled to a bias voltage VCM3, and the DC-blocking circuit 832 is coupled between the input terminal N1 and the voltage scaling circuit 836. The DC-blocking circuit 842 comprises a capacitor Cb and a resistor Rb coupled to the bias voltage VCM3, and the DC-blocking circuit 842 is coupled between the input terminal N2 and the voltage scaling circuit 846. Each of the storage block 830 and the storage block 840 comprises a switched-capacitor including a capacitor Cf with four switches P1'-P4', the storage block 830 is coupled between the negative input node of the amplifier 890 and delay circuit 834, and the storage block 840 is coupled between the positive input node of the amplifier 890 and the delay circuit 844, wherein the capacitor Cf in each of the storage blocks 830 and 840 is scaled by the factor "g". In this embodiment, the amplifier circuit 800 can be used to receive a differential input signal Vip and Vim to generate a differential output signal Vom and Vop.

In the embodiment shown in FIG. 8, the DC-blocking circuit 832 receives the input signal Vip to block the DC component to generate an AC signal, the voltage scaling circuit 836 divides the AC signal to generate a divided signal, the delay circuit 834 delays the divided signal to generate a delayed signal, and the storage block 830 receives the delayed signal to generate a signal for canceling or reducing the aliasing tone generated by the storage block 810. Similarly, the DC-blocking circuit 842 receives the input signal Vim to block the DC component to generate an AC signal, the voltage scaling circuit 846 divides the AC signal to generate a divided signal, the delay circuit 844 delays the divided signal to generate a delayed signal, and the storage block 840 receives the delayed signal to generate a signal for canceling or reducing the aliasing tone generated by the storage block 820. Therefore, in the case that the DC voltages of the input signals Vip and Vim are different, and the amplifier 890 and the storage blocks 810 and 820 have larger signal delay amount, the aliasing tone cancellation circuits 803 and 804 having delay circuits and DC-blocking circuits can exactly cancel or reduce the aliasing tone of the feedback signal generated by the storage blocks 810 and 820. In addition, by designing the voltage scaling circuits 816, 826, 836 and 846, the capacitance of Cf can be designed smaller. Furthermore, by designing the DC-blocking circuits 812 and 822 in the feedback circuits 801 and 802, respectively, the feedback circuit 801/802 and the aliasing tone cancellation circuit 803/804 can have a balanced structure.

Figure 9:
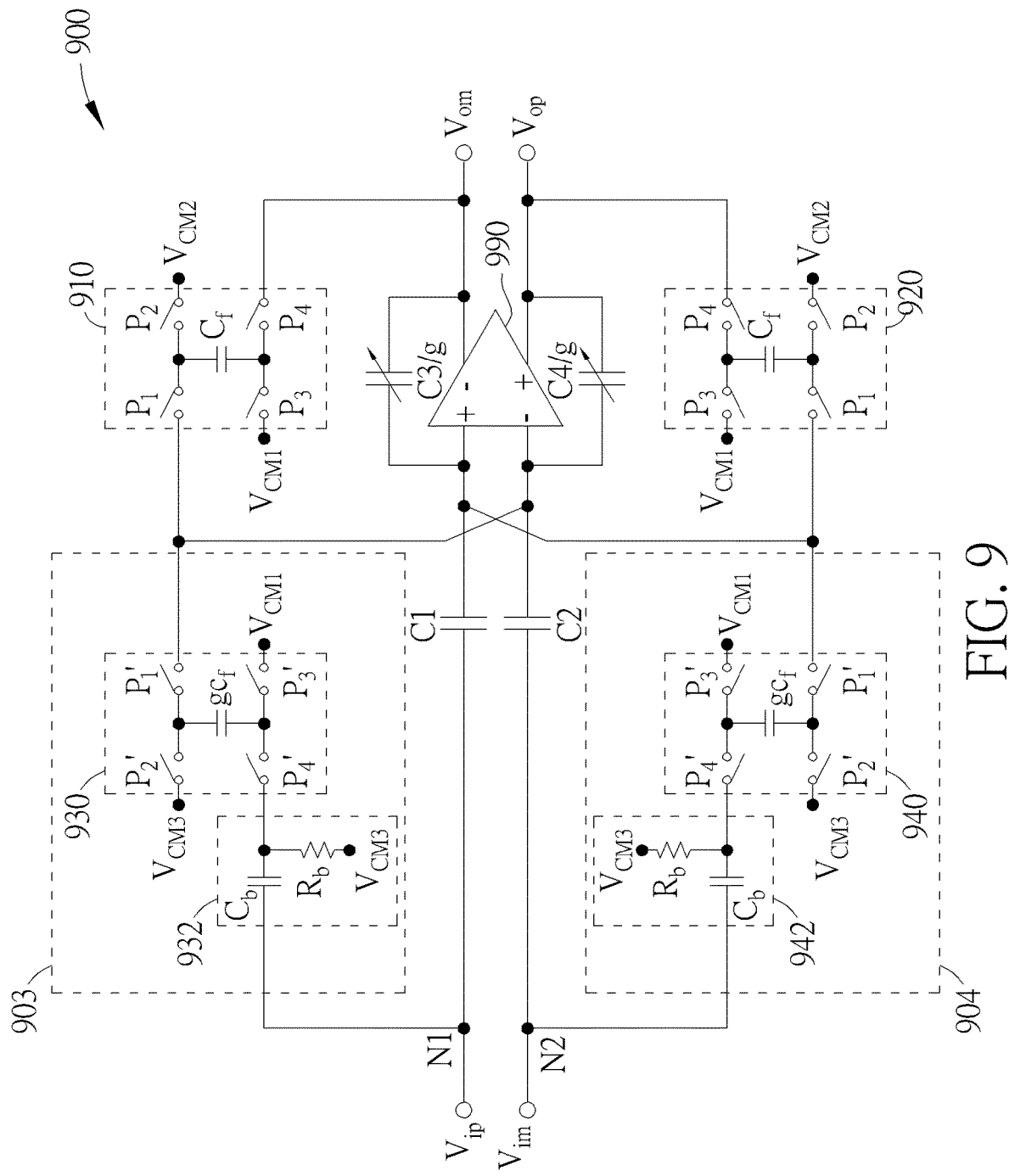
FIG. 9 is a diagram illustrating an amplifier circuit according to one embodiment of the present invention.

FIG. 9 is a diagram illustrating an amplifier circuit 900 according to one embodiment of the present invention. As shown in FIG. 9, the amplifier circuit 900 comprises two input terminals N1 and N2, two capacitors C1 and C2, an amplifier 990, two feedback capacitors C3 and C4, two storage blocks 910 and 920, and two aliasing tone cancellation circuits 903 and 904, wherein the aliasing tone cancellation circuit 903 comprises a storage block 930 and a frequency-selective circuit (in this embodiment, a DC-blocking circuit 932 serves as the frequency-selective circuit), and the aliasing tone cancellation circuit 904 comprises a storage block 940 and a frequency-selective circuit (in this embodiment, a DC-blocking circuit 942 serves as the frequency-selective circuit). In this embodiment, the capacitors C1 and C2 serve as DC-blocking circuits, and the capacitors C1 and C2 are coupled between input terminals of the amplifier 990 and the input terminals N1 and N2, for example, one node of the capacitor C1 is coupled to the input terminal N1, the other node of the capacitor C1 is coupled to a positive input node of the amplifier 990, one node of the capacitor C2 is coupled to the input terminal N2, and the other node of the capacitor C2 is coupled to a negative input node of the amplifier 990. The feedback capacitor C3 is a variable capacitor coupled between a negative output node and the positive input node of the amplifier 990, and the feedback capacitor C4 is a variable capacitor coupled between a positive output node and the negative input node of the amplifier 990, wherein the capacitance of each of the feedback capacitors C3 and C4 is scaled by using a factor "g" shown in FIG. 9. Each of the storage block 910 and the storage block 920 comprises a switched-capacitor including a capacitor Cf with four switches P1-P4, the storage block 910 is coupled between the negative output node and the negative input node of the amplifier 990, and the storage block 920 is coupled between the positive output node and the positive input node of the amplifier 990, wherein the storage blocks 910 and 920 are coupled to bias voltages VCM1 and VCM2. The DC-blocking circuit 932 comprises a capacitor Cb and a resistor Rb coupled to a bias voltage VCM3, wherein the capacitor Cb is coupled to the input terminal N1. The DC-blocking circuit 942 comprises a capacitor Cb and a resistor Rb coupled to the bias voltage VCM3, wherein the capacitor Cb is coupled to the input terminal N2. Each of the storage block 930 and the storage block 940 comprises a switched-capacitor including a capacitor Cf with four switches P1'-P4', the storage block 930 is coupled between the negative input node of the amplifier 990 and DC-blocking circuit 932, and the storage block 940 is coupled between the positive input node of the amplifier 990 and the DC-blocking circuit 942, wherein the capacitor Cf in each of the storage blocks 930 and 940 is scaled by the factor "g". In this embodiment, the amplifier circuit 900 can be used to receive a differential input signal Vip and Vim to generate a differential output signal Vom and Vop, wherein the differential input signal may be audio signals from a microphone.

Figure 10:
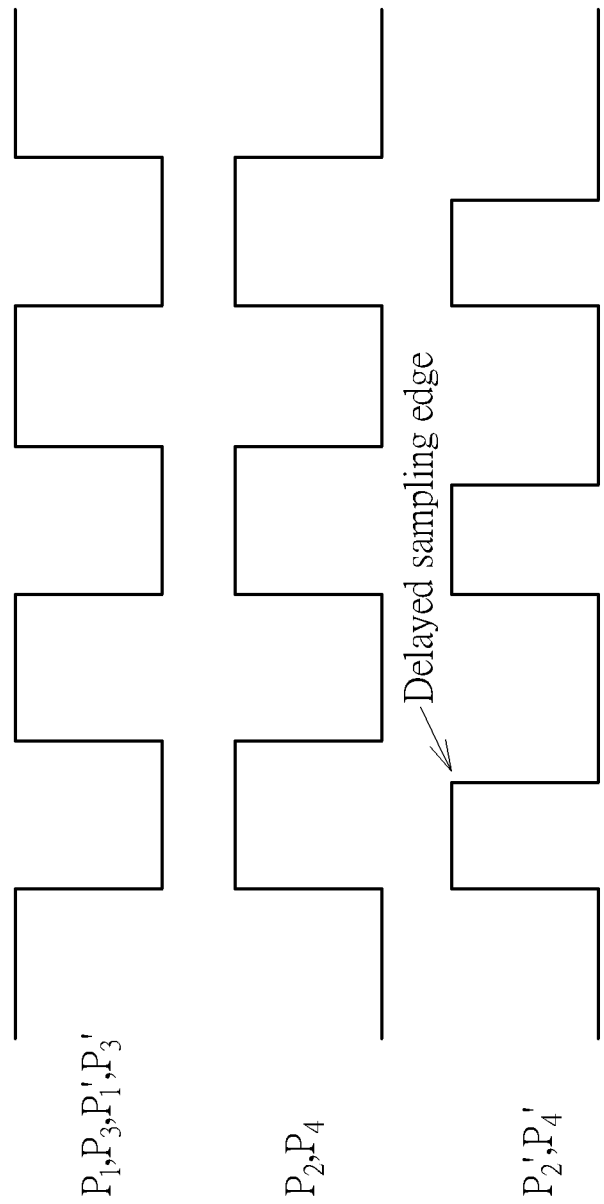
FIG. 10 is a switch control mechanism of the amplifier circuit shown in FIG. 9 according to one embodiment of the present invention.

In the embodiment shown in FIG. 9, the DC-blocking circuit 932 receives the input signal Vip to block the DC component to generate an AC signal, and the storage block 930 receives the AC signal to generate a signal for canceling or reducing the aliasing tone generated by the storage block 910. Similarly, the DC-blocking circuit 942 receives the input signal Vim to block the DC component to generate an AC signal, and the storage block 940 receives the AC signal to generate a signal for canceling or reducing the aliasing tone generated by the storage block 920. In addition, the aliasing tone cancellation circuit 903/904 does not have a physical delay circuit, but the storage blocks 930 and 940 can be controlled to have earlier sampling edge to have the delay function. Specifically, referring to FIG. 10, the switches P1, P3, P1' and P3' are controlled by the same clock signals, the switches P2, P4, P2' and P4' are enabled while the switches P1, P3, P1' and P3' are disabled, and the sampling period of the switch P2'/P4' is shorter than the sampling period of the switch P2/P4. By using the switching control shown in FIG. 10, the storage blocks 930 and 940 can have delay function.

Figure 11:
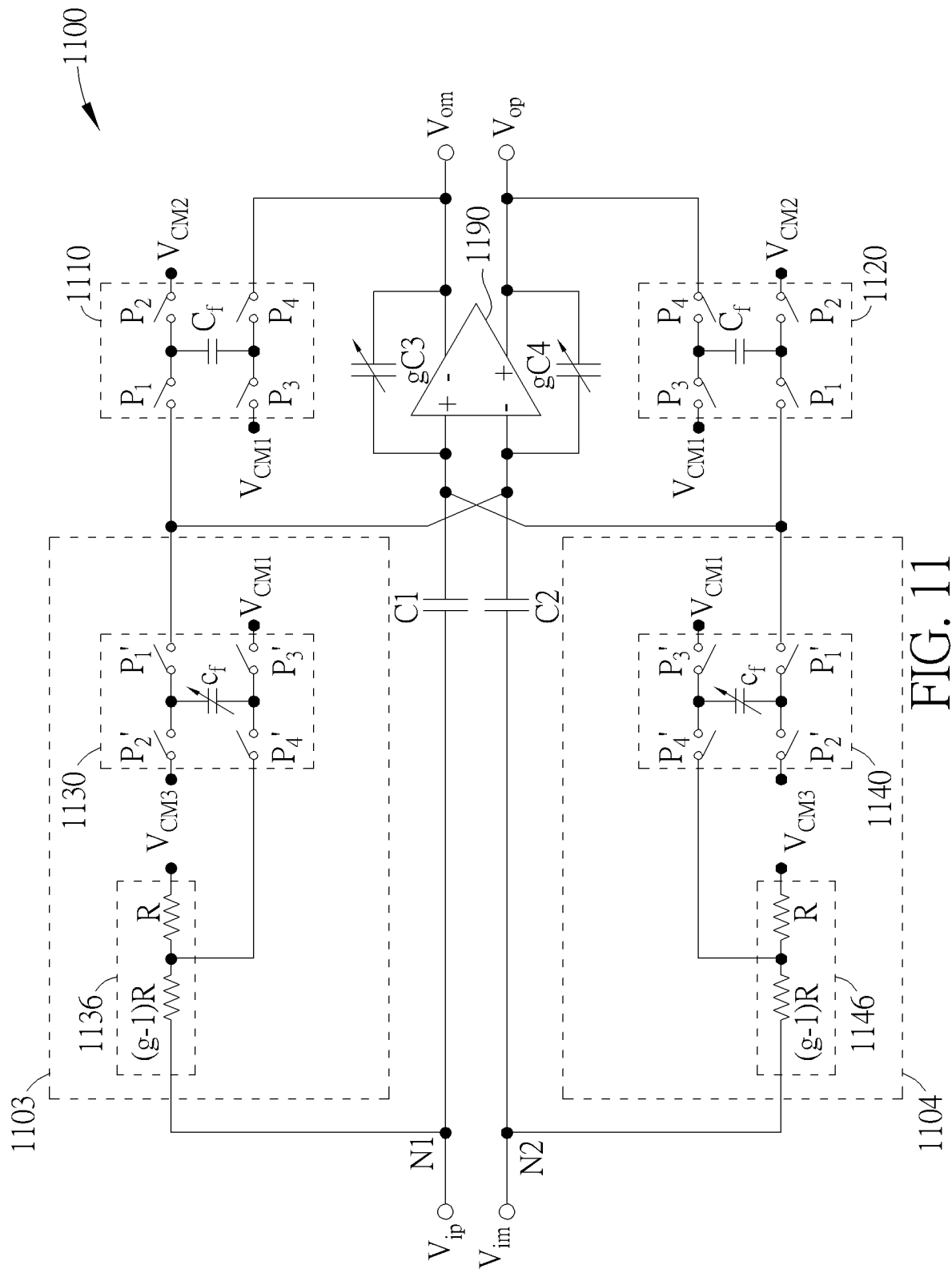
FIG. 11 is a diagram illustrating an amplifier circuit according to one embodiment of the present invention.

FIG. 11 is a diagram illustrating an amplifier circuit 1100 according to one embodiment of the present invention. As shown in FIG. 11, the amplifier circuit 1100 comprises two input terminals N1 and N2, two capacitors C1 and C2, an amplifier 1190, two feedback capacitors C3 and C4, two storage blocks 1110 and 1120, and two aliasing tone cancellation circuits 1103 and 1104, wherein the aliasing tone cancellation circuit 1103 comprises a storage block 1130 and a voltage scaling circuit 1136, and the aliasing tone cancellation circuit 1104 comprises a storage block 1140 and a voltage scaling circuit 1146. In this embodiment, the capacitors C1 and C2 serve as DC-blocking circuits, and the capacitors C1 and C2 are coupled between input terminals of the amplifier 1190 and the input terminals N1 and N2, for example, one node of the capacitor C1 is coupled to the input terminal N1, the other node of the capacitor C1 is coupled to a positive input node of the amplifier 1190, one node of the capacitor C2 is coupled to the input terminal N2, and the other node of the capacitor C2 is coupled to a negative input node of the amplifier 1190. The feedback capacitor C3 is a variable capacitor coupled between a negative output node and the positive input node of the amplifier 1190, and the feedback capacitor C4 is a variable capacitor coupled between a positive output node and the negative input node of the amplifier 1190, wherein the capacitance of each of the feedback capacitors C3 and C4 is scaled by using a factor "g" shown in FIG. 11. Each of the storage block 1110 and the storage block 1120 comprises a switched-capacitor including a capacitor Cf with four switches P1-P4, the storage block 1110 is coupled between the negative output node and the negative input node of the amplifier 1190, and the storage block 1120 is coupled between the positive output node and the positive input node of the amplifier 1190, wherein the storage blocks 1110 and 1120 are coupled to bias voltages VCM1 and VCM2. Each of the voltage scaling circuits 1136 and 1146 comprises two resistors whose resistance are "(g−1)*R" and "R". Each of the storage block 1130 and the storage block 1140 comprises a switched-capacitor including a capacitor Cf with four switches P1'-P4', the storage block 1130 is coupled between the negative input node of the amplifier 1190 and voltage scaling circuit 1136, and the storage block 1140 is coupled between the positive input node of the amplifier 1190 and the voltage scaling circuit 1146. In this embodiment, the amplifier circuit 1100 can be used to receive a differential input signal Vip and Vim to generate a differential output signal Vom and Vop.

In the embodiment shown in FIG. 11, the voltage scaling circuit 1136 divides the input signal Vip to generate a divided signal, and the storage block 1130 receives the divided signal to generate a signal for canceling or reducing the aliasing tone generated by the storage block 1110. Similarly, the voltage scaling circuit 1146 divides the input signal Vim to generate a divided signal, and the storage block 1140 receives the divided signal to generate a signal for canceling or reducing the aliasing tone generated by the storage block 1120. By designing the voltage scaling circuits 1136 and 1146, the charges in the input and feedback of the storage block 1130/1140 become equal.

Figure 12:
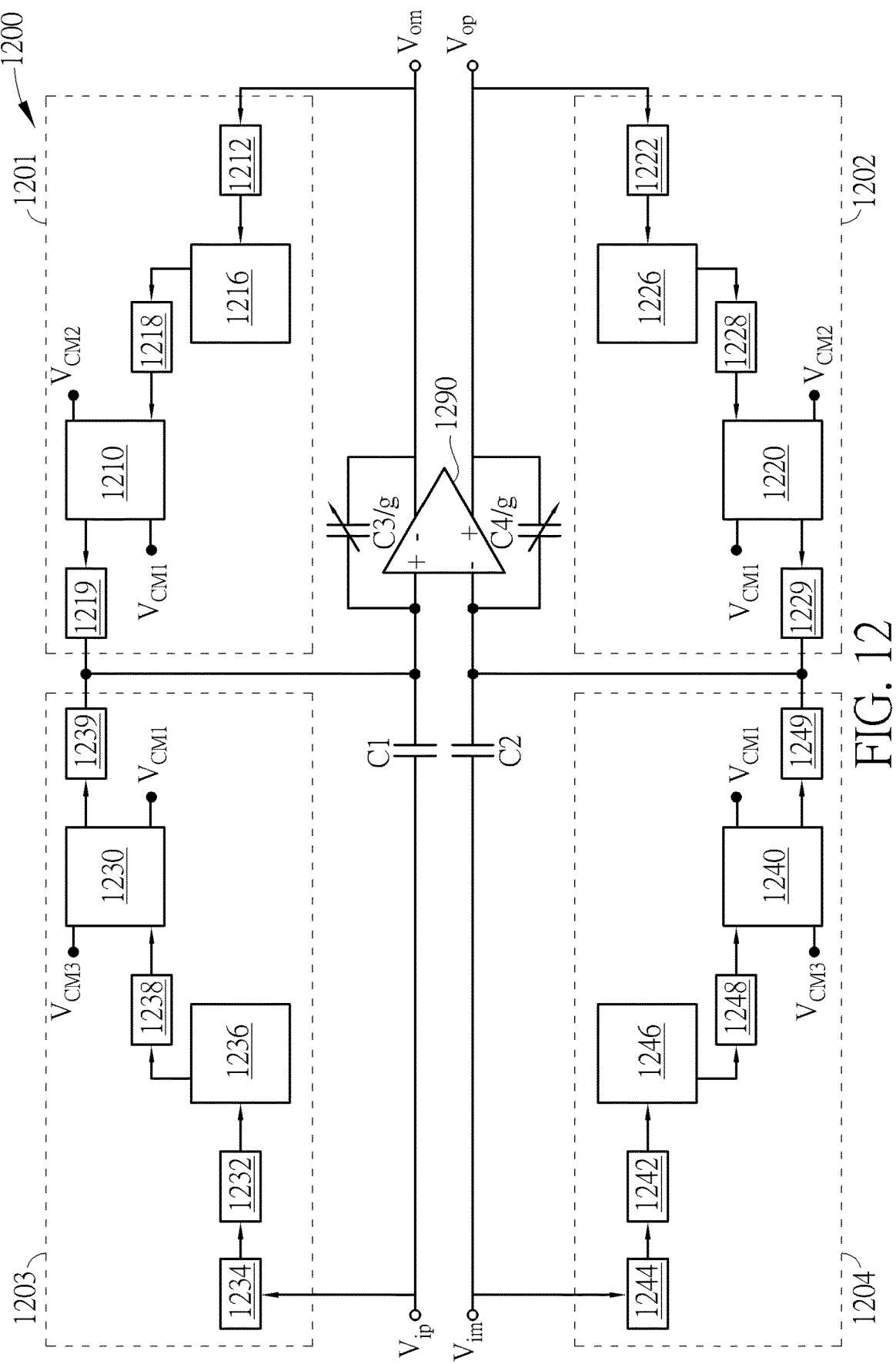
FIG. 12 is a diagram illustrating an amplifier circuit according to one embodiment of the present invention.

FIG. 12 is a diagram illustrating an amplifier circuit 1200 according to one embodiment of the present invention. As shown in FIG. 12, the amplifier circuit 1200 comprises two input terminals N1 and N2, two capacitors C1 and C2, an amplifier 1290, two feedback capacitors C3 and C4, two feedback circuits 1201 and 1202, and two aliasing tone cancellation circuits 1203 and 1204, wherein the feedback circuit 1201 comprises a storage block 1210, a DC-blocking circuit 1212, a voltage scaling circuit 1216 and two filters 1218 and 1219; the feedback circuit 1202 comprises a storage block 1220, a DC-blocking circuit 1222, a voltage scaling circuit 1226 and two filters 1228 and 1229; the aliasing tone cancellation circuit 1203 comprises a storage block 1230, a DC-blocking circuit 1232, a delay circuit 1234, a voltage scaling circuit 1236, and two filters 1238 and 1239; and the aliasing tone cancellation circuit 1204 comprises a storage block 1240, a DC-blocking circuit 1242, a delay circuit 1244, a voltage scaling circuit 1246, and two filters 1248 and 1249. In this embodiment, the amplifier circuit 1200 can be used to receive a differential input signal Vip and Vim to generate a differential output signal Vom and Vop, wherein the differential input signal may be audio signals from a microphone.

In the amplifier circuit 1200, referring to the above embodiments shown in FIG. 1-FIG. 11, the aliasing tone cancellation circuit 1203 is configured to receive the input signal Vip to generate a signal to cancel or reduce the aliasing tone of the feedback signal generated by the feedback circuit 1201, the aliasing tone cancellation circuit 1204 is configured to receive the input signal Vim to generate a signal to cancel or reduce the aliasing tone of the feedback signal generated by the feedback circuit 1202. The DC-block circuit 1212/1222/1232/1242 is configured to block the DC component of the received signal. The delay circuit 1234/1244 is configured to delay the received signal. The voltage scaling circuit 1216/1226/1236/1246 is configured to perform a voltage-dividing operation on the received signal. The filter 1218/1228/1238/1248 is configured to filter the unwanted frequency component of the received signal, wherein the filter 1218/1228 matches the filter 1238/1248. The filter 1219/1229/1239/1249 is configured to filter the unwanted frequency component of the received signal, wherein the filter 1219/1229 fully matches or partially matches the filter 1239/1249. The storage block 1210/1220/1230/1240 comprises a switched-capacitor. Referring to the above embodiments shown in FIG. 1-FIG. 11, at least part of the DC-blocking circuit 1212, the voltage scaling circuit 1216 and the filters 1218 and 1219 can be removed from the feedback circuit 1201, and the positions of the DC-blocking circuit 1212 and the voltage scaling circuit 1216 can be interchanged. At least part of the DC-blocking circuit 1222, the voltage scaling circuit 1226 and the filters 1228 and 1229 can be removed from the feedback circuit 1202, and the positions of the DC-blocking circuit 1222 and the voltage scaling circuit 1226 can be interchanged. At least part of the DC-blocking circuit 1232, the delay circuit 1234, the voltage scaling circuit 1236, and the filters 1238 and 1239 can be removed from the aliasing tone cancellation circuit 1203, and the positions of any two of these components can be interchanged. At least part of the DC-blocking circuit 1242, the delay circuit 1244, the voltage scaling circuit 1246, and the filters 1248 and 1249 can be removed from the aliasing tone cancellation circuit 1204, and the positions of any two of these components can be interchanged. In addition, any block, including the storage block 1210/1220/1230/1240, can be interchanged, and any two or more blocks in FIG. 12 can be combined.

In addition, the connections of two differential sides of the storage blocks 1230 and 1240 to the amplifier 1290 can be interchanged depending upon the types of the storage block 1230 and 1240. Specifically, in one embodiment, the storage block 1230 is coupled to the positive input node of the amplifier 1290 while the storage block 1240 is coupled to the negative node of the amplifier 1290. In another embodiment, the storage block 1230 is coupled to the negative input node of the amplifier 1290 while the storage block 1240 is coupled to the positive input node of the amplifier 1290.

It is noted that the above-mentioned DC block circuit 1212/1222/1232/1242 can be replaced by any suitable frequency-selective filter, the storage block 1210/1220/1230/1240 may be implemented by any suitable switched-capacitor.

Figure 13:
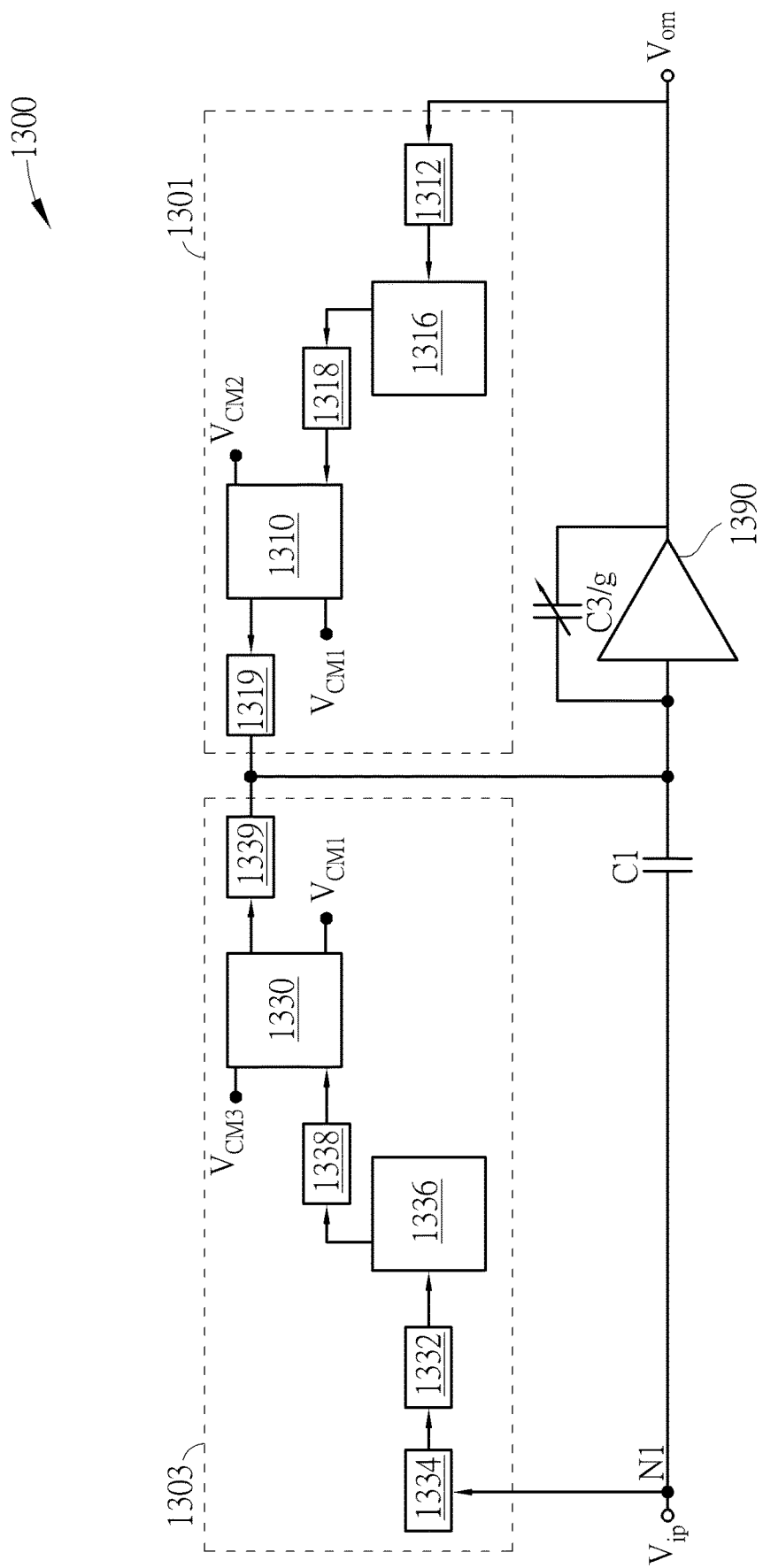
FIG. 13 is a diagram illustrating an amplifier circuit according to one embodiment of the present invention.

In the embodiments shown in FIG. 1-FIG. 12, the amplifier circuit has a differential structure, but it's not a limitation of the present invention. FIG. 13 is a diagram illustrating an amplifier circuit 1300 according to one embodiment of the present invention. As shown in FIG. 13, the amplifier circuit 1300 comprises an input terminal N1, a capacitor C1, an amplifier 1390, a feedback capacitor C3, a feedback circuit 1301 and an aliasing tone cancellation circuit 1303, wherein the feedback circuit 1301 comprises a storage block 1310, a DC-blocking circuit 1312, a voltage scaling circuit 1316 and two filters 1318 and 1319; and the aliasing tone cancellation circuit 1303 comprises a storage block 1330, a DC-blocking circuit 1332, a delay circuit 1334, a voltage scaling circuit 1336, and two filters 1338 and 1339. In this embodiment, the amplifier circuit 1300 can be used to receive an input signal Vip to generate an output signal Vom. Because the operation of the amplifier circuit 1300 can be understood by a person skilled in the art after reading the above embodiments, further descriptions are omitted here.

Briefly summarized, in the amplifier circuit of the present invention, by using the aliasing tone cancellation circuit between an input terminal of the amplifier circuit and an input terminal of the internal amplifier, the aliasing tone generated by the feedback circuit of the internal amplifier can be canceled or reduced, and the signal quality of the output signal can be greatly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
   a first input terminal, configured to receive a first input signal;
   a first capacitor, coupled to the first input terminal;
   an amplifier, coupled to the first capacitor, configured to receive the first input signal through the first capacitor to generate a first output signal;
   a first feedback circuit, coupled between a first input node and a first output node of the amplifier, configured to generate a first feedback signal according to the first output signal, wherein the first feedback circuit comprises a first storage block comprising a first switched-capacitor; and
   a first aliasing tone cancellation circuit, coupled between the first input terminal of the amplifier circuit and the first input node of the amplifier, configured to generate a first signal to cancel or reduce an aliasing tone of the first feedback signal according to the first input signal;
   wherein the first aliasing tone cancellation circuit comprises a second storage block comprising a second switched-capacitor;
   wherein the first aliasing tone cancellation circuit further comprises:
   a frequency-selective filter;
   wherein the first input signal is processed by the frequency-selective filter to generate a processed signal, and the second storage block receives the processed signal to generate the first signal to cancel or reduce the aliasing tone of the first feedback signal.

2. The amplifier circuit of claim 1, wherein the second switched-capacitor is a replica of the first switched-capacitor.

3. The amplifier circuit of claim 1, wherein the first aliasing tone cancellation circuit further comprises:
   a delay circuit;
   wherein the first input signal is processed by the frequency-selective filter and the delay circuit to generate the processed signal.

4. The amplifier circuit of claim 1, wherein the first aliasing tone cancellation circuit further comprises:
   a delay circuit; and
   a voltage scaling circuit;
   wherein the first input signal is processed by the frequency-selective filter, the delay circuit and the voltage scaling circuit to generate the processed signal.

5. The amplifier circuit of claim 4, wherein the first feedback circuit further comprises a voltage scaling circuit.

6. The amplifier circuit of claim 4, wherein the first feedback circuit further comprises a voltage scaling circuit and a frequency-selective filter.

7. The amplifier circuit of claim 1, wherein the second switched-capacitor has earlier sampling edge than the first switched-capacitor.

8. An amplifier circuit, comprising:
   a first input terminal, configured to receive a first input signal;
   a first capacitor, coupled to the first input terminal;
   an amplifier, coupled to the first capacitor, configured to receive the first input signal through the first capacitor to generate a first output signal;
   a first feedback circuit, coupled between a first input node and a first output node of the amplifier, configured to generate a first feedback signal according to the first output signal, wherein the first feedback circuit comprises a first storage block comprising a first switched-capacitor; and
   a first aliasing tone cancellation circuit, coupled between the first input terminal of the amplifier circuit and the first input node of the amplifier, configured to generate a first signal to cancel or reduce an aliasing tone of the first feedback signal according to the first input signal;

wherein the first aliasing tone cancellation circuit comprises a second storage block comprising a second switched-capacitor;

wherein the first aliasing tone cancellation circuit further comprises:

a voltage scaling circuit;

wherein the first input signal is processed by the voltage scaling circuit to generate a processed signal, and the second storage block receives the processed signal to generate the first signal to cancel or reduce the aliasing tone of the first feedback signal.

9. An amplifier circuit, comprising:

a first input terminal, configured to receive a first input signal;

a first capacitor, coupled to the first input terminal;

an amplifier, coupled to the first capacitor, configured to receive the first input signal through the first capacitor to generate a first output signal;

a first feedback circuit, coupled between a first input node and a first output node of the amplifier, configured to generate a first feedback signal according to the first output signal, wherein the first feedback circuit comprises a first storage block comprising a first switched-capacitor;

a first aliasing tone cancellation circuit, coupled between the first input terminal of the amplifier circuit and the first input node of the amplifier, configured to generate a first signal to cancel or reduce an aliasing tone of the first feedback signal according to the first input signal;

a second input terminal, configured to receive a second input signal;

a second capacitor, coupled to the second input terminal;

a second feedback circuit, coupled between a second input node and a second output node of the amplifier, configured to generate a second feedback signal according to the second output signal, wherein the second feedback circuit comprises a third storage block comprising a third switched-capacitor; and a second aliasing tone cancellation circuit, coupled between the second input terminal of the amplifier circuit and the second input node of the amplifier, configured to generate a second signal to cancel or reduce an aliasing tone of the second feedback signal according to the second input signal;

wherein the first input signal and the second input signal form a differential signal, and the amplifier is further configured to receive the second input signal through the second capacitor to generate a second output signal.

10. The amplifier circuit of claim 9, wherein the first aliasing tone cancellation circuit comprises a second storage block comprising a second switched-capacitor, and the second aliasing tone cancellation circuit comprises a fourth storage block comprising a fourth switched-capacitor.

11. The amplifier circuit of claim 10, wherein the second switched-capacitor is a replica of the first switched-capacitor, and the fourth switched-capacitor is a replica of the third switched-capacitor.

* * * * *